United States Patent
Lin et al.

(10) Patent No.: US 6,741,626 B2
(45) Date of Patent: May 25, 2004

(54) COMMON ASSEMBLY STRUCTURE OF LASER DIODE AND MONITORING PIN DETECTOR

(75) Inventors: Yung-Sen Lin, Taipei (TW); Fu-Hsing Hou, Chiayi Hsien (TW); Chih-Hao Chang, Hsinchu-Hsien (TW); Kuo-Jen Chen, Chinmen Hsien (TW)

(73) Assignee: TrueLight Corporation, Hsinchu (TW)

( * ) Notice: Subject to any disclaimer, the term of this patent is extended or adjusted under 35 U.S.C. 154(b) by 0 days.

(21) Appl. No.: 10/212,227

(22) Filed: Aug. 6, 2002

(65) Prior Publication Data

US 2003/0035456 A1 Feb. 20, 2003

(30) Foreign Application Priority Data

Aug. 17, 2001 (TW) .......................... 90120321 A (51) Int. Cl.$^7$ ................................. H01S 5/00
(52) U.S. Cl. ........................... 372/50; 372/36
(58) Field of Search ................. 372/36, 50, 109

(56) References Cited

U.S. PATENT DOCUMENTS

| | | | | |
|---|---|---|---|---|
| 4,996,169 A | * | 2/1991 | Lee ........................... 437/209 |
| 5,479,029 A | * | 12/1995 | Uchida et al. ................ 257/81 |
| 5,812,582 A | * | 9/1998 | Gilliland et al. .............. 372/50 |
| 5,835,514 A | * | 11/1998 | Yuen et al. ................... 372/36 |
| 6,349,105 B1 | * | 2/2002 | Gilliland et al. .............. 372/50 |
| 6,587,495 B2 | * | 7/2003 | Nakamori et al. ............. 372/50 |
| 6,597,713 B2 | * | 7/2003 | Ouchi .......................... 372/36 |

* cited by examiner

Primary Examiner—Kevin Pyo
Assistant Examiner—Davienne Monbleau (57) ABSTRACT

A common assembly structure of laser diode and PIN detector comprises a subassembly structure formed by connecting a laser diode to a submount made of low-capacitance material, and the sub-assembly structure is then implemented on a PIN detector. The so-called laser diode comprises a vertical cavity surface emitting laser (VCSEL) and an edge-emitting laser (EEL), wherein the EEL further comprises, for example, a Fabry-Perot Laser (F-P Laser) and a Distributed Feedback Bragg Laser. The common assembly structure of laser diode and PIN detector completely separates the anode and cathode of the semiconductor laser from the anode and cathode of the PIN detector thereby effectively reducing the parasitic capacitance effect derived from the PIN detector itself and the assembly structure, and is suitable for use in the high-speed laser driving circuits.

15 Claims, 8 Drawing Sheets

COMMON ASSEMBLY STRUCTURE OF LASER DIODE AND MONITORING PIN DETECTOR

FIELD OF THE INVENTION

The present invention relates to an assembly structure of laser diode, and more particularly, to a common assembly structure of vertical cavity surface emitting laser (VCSEL) and monitoring positive-intrinsic-negative (PIN) detector.

BACKGROUND OF THE INVENTION

In Taiwan, optoelectronic industry is a hi-tech industry next to the electronic industry received intensive focus from the government. Currently, the rapidly developed optoelectronic industry is to combine both electronics and optics so as to explore a new application filed. An optical transmitting and receiving module comprises a transmitter, and a receiver, or the module is integrated as a transceiver.

The function of transmitter is to convert an electronic signal to a light signal and then transmit the light signal. Transmitters are generally classified in accordance with the light source, and the light source of the optical fiber communication is mainly from a light emitting diode (LED) or a laser diode. Since the laser diode has the advantages of high output power, fast transmitting speed, small emitting angle (i.e. a higher efficiency for coupling light source into an optical fiber), and narrower frequency spectrum (smaller dispersion), the laser diode is suitable for use in the transmission of middle or high distance. While LED has the advantages of low cost and simpler utilization (simpler driving and compensation circuits), LED is suitable for use in the transmission of shorter distance. Particularly, the laser diode or called semiconductor laser has the advantages of small size, low power consumption, quick response, good collision resistance, long operation life, and high efficiency, etc., so that the laser diode is very widely used in the application of optoelectronic products. The fabrication of laser diode is delicate and precise, and requires high technical level with the use of expensive manufacturing equipments. Hence, viewing from the whole optoelectronic industry, the laser diode is a very important critical device. According to the wavelength and the applications, the laser diode is roughly divided into a short-wavelength laser and a long-wavelength laser, wherein the short-wavelength laser generally stands for the laser with 390 nm to 950 nm in wavelength, which is mainly used in the applications of optical information and display, for example, CD-ROM drives, laser printers, bar code readers, and indicators, etc., and the long-wavelength laser stands for the laser with 980 nm to 1550 nm in wavelength, which is mainly used in the optical fiber communication. Another rapidly developed laser diode is a VCSEL, which is mainly different from a conventional laser diode in the relative position between a resonant cavity and an epilayer. The conventional diode has the resonant cavity parallel to the epilayer, and a reflecting surface formed by using a naturally cleaved facet normal to the epilayer thereby emitting the laser from the edge, so that the conventional diode is called an edge-emitting laser (EEL), such as a Fabry Perot Laser (F-P Laser) and a distributed feedback laser, etc., while the laser diode rapidly developed has a cavity perpendicular to the epilayer, and a reflecting surface formed with an epilayer or a surface dielectric film thereby emitting the laser from the front, so that the laser diode rapidly developed is called a VCSEL. Since the VCSEL has a very short resonant cavity and few gain media, the output power is extremely limited, and a typical VCSEL has only about few mWs output power. However, the light beam output from VCSEL is circular and symmetrical, which is very easy to couple with an optical fiber and is convenient for forming a VCSEL array, so that VCSEL is expected to replace part of the low-powered EEL diodes for further lowering the system price with a very promising future. Furthermore, the VCSEL with 850 nm in wavelength had been put into the market in 1997, and began to enter various LAN applications since 1998, wherein the VCSEL has been adopted in the standard of gigabit transmission modules, for example, fibre channel link, and gigabit Ethernet, etc., for transmitting a large amount of information within short distance.

Further, the main function of optical receiver is to convert a light signal to an electronic signal, of which the most critical component is a detector. The detector must have the characteristics of low noise, small error, high reliability, high response speed and high sensitivity. The major principle of the detector is to generate enough energy by radiating light on a photo diode for exciting pairs of electrons and holes especially in the depletion region on the pn junction, so as to generate a current signal while a reverse bias is applied externally. The most popularly detectors used in the current optical fiber communication are positive-intrinsic-negative (PIN) detector and avalanche photodiode (APD). The PIN detector is mainly to implement an intrinsic layer between the p-type diode and the n-type diode in a common pn diode to broaden the depletion region for enhancing the current excited from a light source thereby increasing the sensitivity. However, broadening the intrinsic layer also slows down the response speed, so that the balance between increasing sensitivity and maintaining response speed has become the major design consideration. Since a PIN detector is low in cost, and also is good enough for meeting the needs of communication, it is more popularly used. The APD photodiode is mainly different from the PIN detector in producing a higher potential inside the diode and broadening the depletion region to use the electrons and holes excited by the light source as major carriers, and producing secondary carriers by the collisions of the major carriers driven by the high kinetic energy from the high potential, so that a current larger than that from the PIN detector can be generated, wherein the response speed is quicker with the bigger reverse bias. Although the APD photodiode frequently can generate a larger current up to hundreds volts, yet a dark current is formed with the bigger reverse bias, and the dark current becomes one of the noise sources. The so-called dark current means that, due to the high reverse bias, a current can be generated even without the electrons and holes excited by the light source.

SUMMARY OF THE INVENTION

Figure 1A:
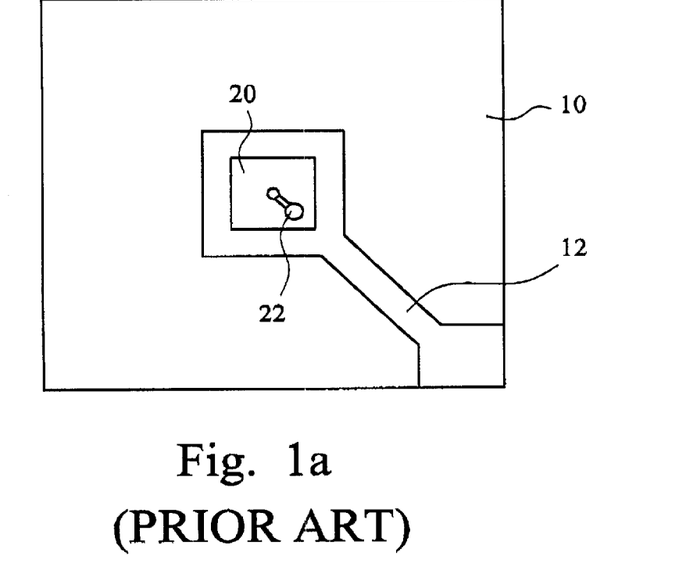
FIG. 1a is a top view showing a conventional common assembly structure of VCSEL and monitoring PIN detector.
Figure 1B:
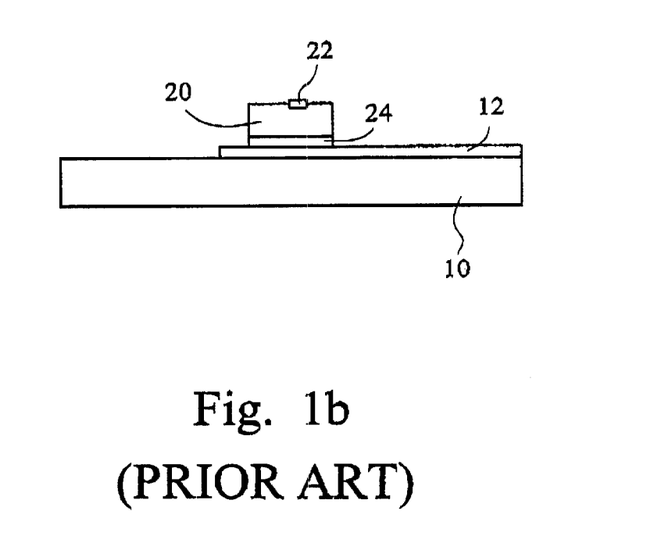
FIG. 1b is a cross-sectional view showing the conventional common assembly structure of VCSEL and monitoring PIN detector.

A conventional common assembly structure of VCSEL and monitoring PIN detector is formed by connecting an electrode of a VCSEL to an electrode of a PIN detector, such as a common anode assembly of laser diode, and a common cathode assembly of laser diode. FIG. 1a is a top view showing a conventional common assembly structure of a VCSEL and a monitoring PIN detector, and FIG. 1b is a cross-sectional view showing the conventional common assembly structure of a VCSEL and a monitoring PIN detector. Referring to FIG. 1a and FIG. 1b at the same time, the conventional common assembly structure of a laser diode and a PIN detector comprises a PIN detector 10, wherein an electrode region 12 is located on the surface of the PIN detector 10, and a laser diode 20 is in the electrode region 12 on the PIN detector 10. The laser diode 20 has an anode and a cathode, and these electrodes can be located respectively on the upper and lower sides of the laser diode 20, wherein an electrode 22 is on the upper side of the laser diode 20, and an electrode 24 having the different electrical property from the electrode 22 of the laser diode 20 is connected to the electrode region 12 of the PIN detector 10. Furthermore, the common anode assembly of laser diode is to connect the anode of a semiconductor laser and the cathode of a PIN detector to a common electrode, and the common cathode assembly of laser diode is to connect the cathode of a semiconductor laser and the anode of a PIN detector to a common electrode. Since the conventional assembling method is to make the laser diode and the PIN detector use a common electrode, the device assembled has a higher parasitic capacitance and bigger driving load and thus is difficult to be driven with high speed.

In order to improve the aforementioned disadvantage of the conventional technique, the present invention hence provides a common assembly structure of VCSEL and monitoring PIN detector for suitable use in high-speed laser driving circuits. In the assembly structure of the present invention, the anode and cathode of semiconductor laser are completely isolated from the anode and cathode of PIN detector, so as to effectively lower the parasitic capacitance effect resulted from the PIN detector itself and the assembly structure.

Here only VCSEL is explained herein with figures, however the aforementioned description of the present invention is suitable for use in VCSEL, EEL, DFB laser and other semiconductor lasers.

According to the aforementioned object, the present invention provides a common assembly structure of laser diode and PIN detector, and the common assembly comprises: a sub-assembly structure composed of a laser diode formed on a PIN detector without directly contacting the anode and cathode of the PIN detector, wherein the sub-assembly structure comprises: the laser diode formed on a submount with one electrode of the laser diode connected to the conductive region of the submount and the other electrode connected to the electrode of the submount.

Furthermore, the common assembly structure of laser diode and PIN detector according to the present invention can be derived to a structure comprising: a laser diode having an anode and a cathode and being implemented on a submount which is located on a PIN detector having an anode and a cathode, wherein, first, the anode of the laser diode is electrically isolated from the cathode of the PIN detector, and the cathode of the laser diode is also electrically isolated from the anode of the PIN detector, and secondly, the anode of the laser diode and the cathode of the PIN detector are in electrical contact but located in parallel on a low-capacitance submount, so that the equivalent circuit at any terminal is effected by the low-capacitance submount, thereby lowering the RC time constant and promoting the product speed, and thirdly, the anode of the laser diode and the cathode of the PIN detector electrode are in electrical contact but located in parallel on a low-capacitance submount, so that the equivalent circuit at any terminal is effected by the low-capacitance submount, thereby lowering the RC time constant and promoting the product speed.

The common assembly structure of laser diode and PIN detector according to the present invention further comprises a laser diode having an anode and a cathode, and a PIN detector having an anode and a cathode, wherein the anode of the laser diode and the cathode of the PIN detector are electrically isolated, and the cathode of the laser diode and the anode of the PIN detector are also electrically isolated.

In the common assembly structure of laser diode and PIN detector according to the present invention, the submount is made of the low capacitance materials, for example, aluminum nitride, aluminum oxide, glass, quartz and silicon oxide, etc. The common assembling structure of the present invention can also be utilized for the laser diodes such as VCSEL EEL and DFB laser, etc.

DETAILED DESCRIPTION OF THE PREFERRED EMBODIMENT

Figure 2:
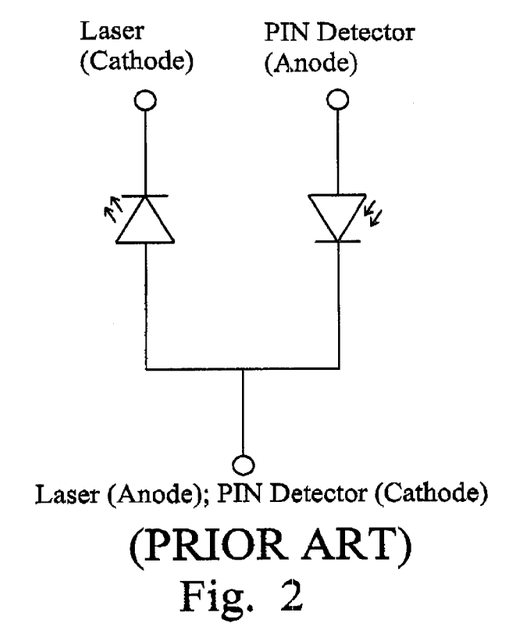
FIG. 2 is a schematic view showing the definition of electrodes on a conventional common anode assembly of laser diode.
Figure 3:
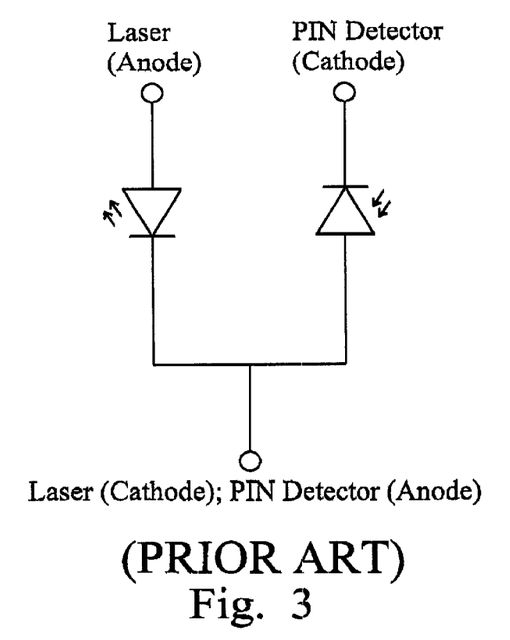
FIG. 3 is a schematic view showing the definition of electrodes on a conventional common cathode assembly of laser diode.

In a conventional common assembly structure of VCSEL and monitoring PIN detector, one of the electrodes of semiconductor laser is connected to one electrode of the PIN detector, such as shown in FIG. 2, a schematic view showing the definition of electrodes on a conventional common anode assembly of laser diode, and in FIG. 3, a schematic view showing the definition of electrodes on a conventional common cathode assembly of laser diode. Referring to FIG. 2, the method for assembling a common anode assembly of laser diode is to connect the anode of semiconductor laser and the cathode of PIN detector to a common electrode. Referring to FIG. 3, the method for assembling a common cathode assembly of laser diode is to connect the cathode of semiconductor laser and the anode of PIN detector to a common electrode. Since these two assembling methods make both laser diode and PIN detector use a common electrode, the parasitic capacitance generated in the semiconductor laser from the assembling process comprises the parasitic capacitance from the nature of assembling, and the one from the PIN detector, so that the semiconductor devices assembled have a larger driving load. Further, with a large driving load, the semiconductor devices have poor characteristics of high-speed driving frequency.

Figure 4A:
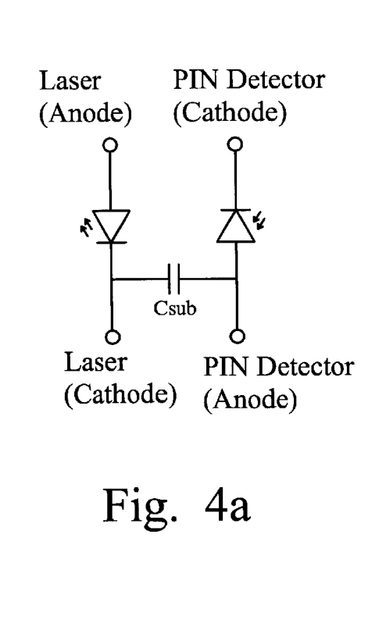
FIG. 4a is a schematic view showing the definition of separated electrodes on a common assembly structure of laser diode and PIN detector according to the present invention.
Figures 4B, 4C:
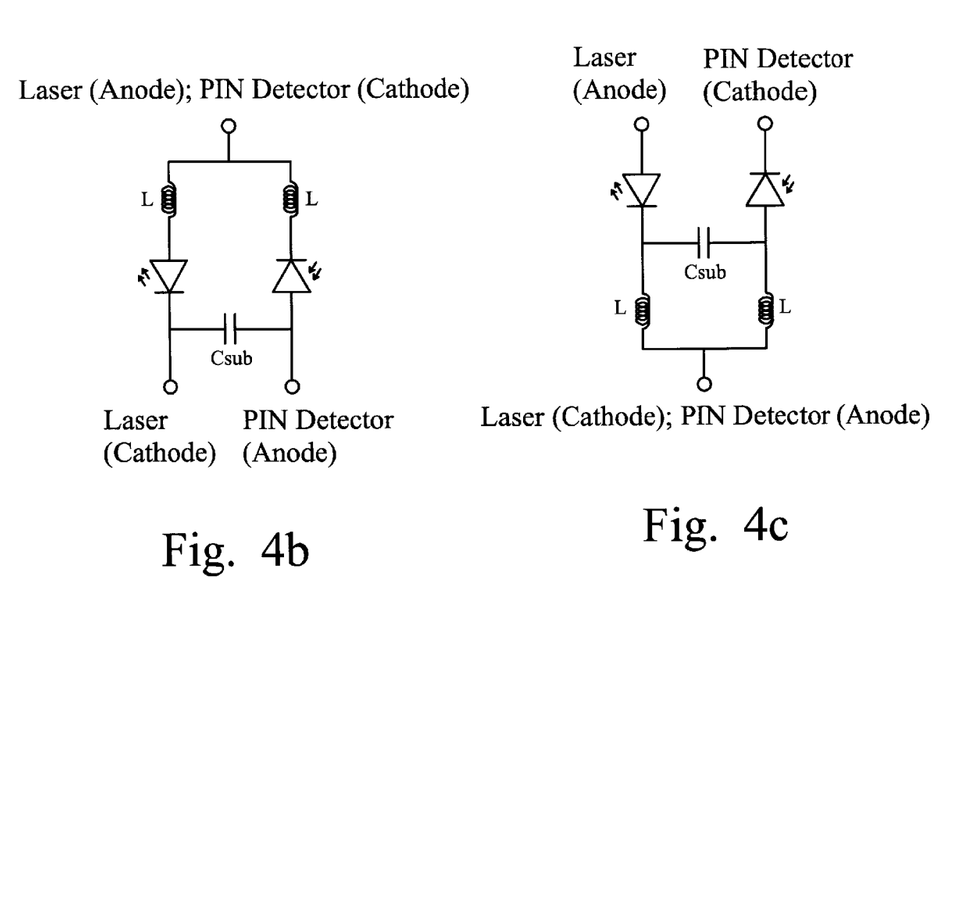
FIG. 4b is a schematic view showing the definition of improved common anode on a common assembly structure of laser diode and PIN detector according to the present invention.
FIG. 4c is a schematic view showing the definition of improved common cathode on a common assembly structure of VCSEL and monitoring PIN detector according to the present invention.

Hence, the present invention provides a common assembly structure of laser diode and PIN detector, and the common assembly structure is suitable for use in high-speed laser driving circuits. Besides, the devices with the same numbers and symbols referred in the present invention have the same functions and locations with one another. FIG. 4a is a schematic view showing the definition of separated electrodes on a common assembly structure of laser diode and PIN detector according to the present invention. Referring to FIG. 4a, in a common assembly structure of the present invention, the anode and cathode of semiconductor laser are completely isolated from the anode and cathode of PIN detector, thereby providing a design method for users to develop their ideas completely and independently on driving circuit designs, wherein $C_{sub}$ in FIG. 4a is a parasitic capacitance on a submount. Furthermore, in the common assembly structure of the present invention, the semiconductor laser is implemented on a sub-assembly structure having a low-capacitance submount, so as to lower the parasitic capacitance derived from the PIN detector and the assembly structure itself effectively. The common assembly structure of the present invention can further match up with a conventional assembling method, such as shown in FIG. 4b and FIG. 4c. Referring to FIG. 4b and FIG. 4c, FIG. 4b is a schematic view showing the definition of improved common anode on a common assembly structure of laser diode and PIN detector according to the present invention, and FIG. 4c is a schematic view showing the definition of improved common cathode on a common assembly structure of laser diode and PIN detector according to the present invention, wherein L is an inductance generated from assembling.

Figure 5A:
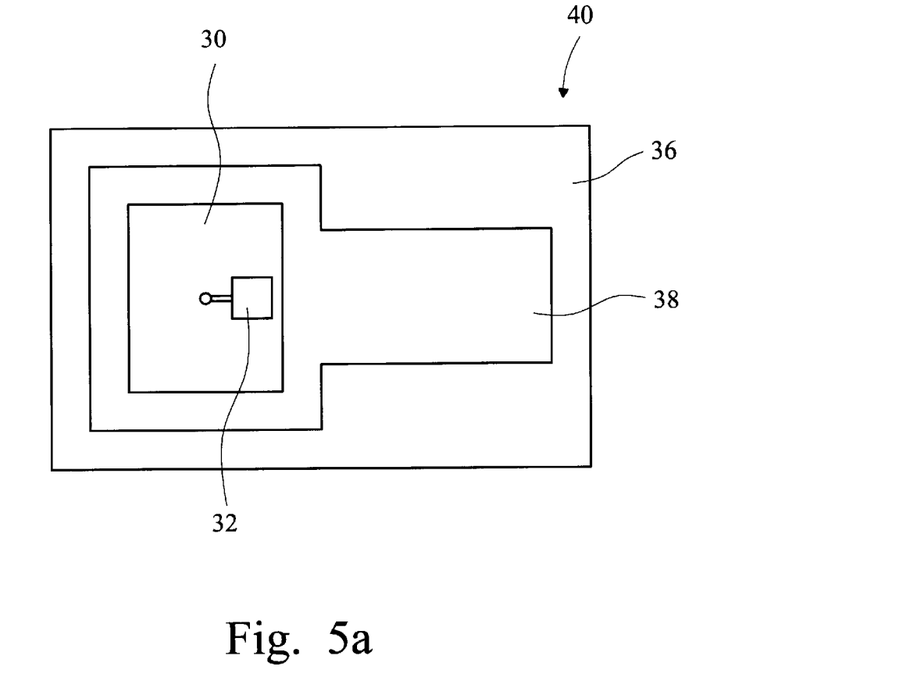
FIG. 5a is a top view showing a sub-assembly structure of VCSEL of the present invention.
Figure 5B:
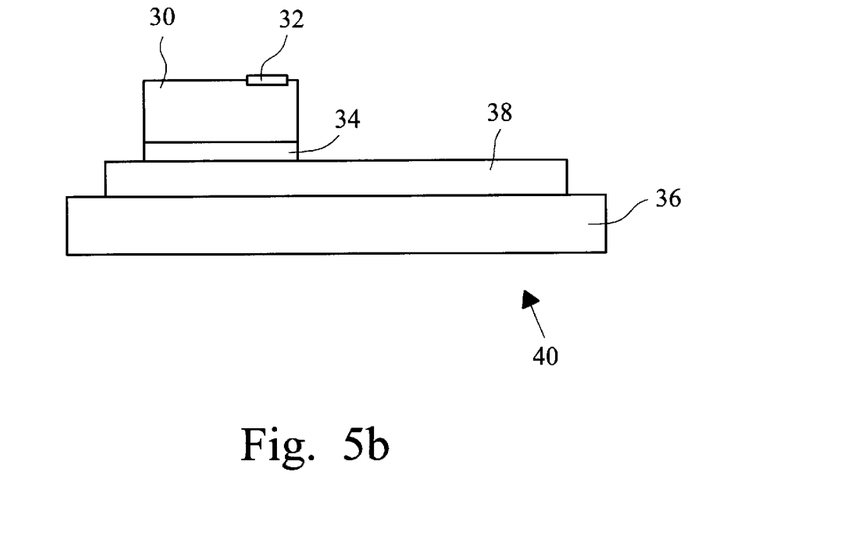
FIG. 5b is a cross-sectional view showing the sub-assembly structure of VCSEL of the present invention.

FIG. 5a is a top view showing a sub-assembly structure of laser diode of the present invention, and FIG. 5b is a cross-sectional view showing the sub-assembly structure of laser diode of the present invention. Referring to both FIG. 5a and FIG. 5b, a sub-assembly structure 40 of the present invention comprises a submount 36 with a conductive region 38 on the surface of the submount 36, and a laser diode 30 located in the conductive region 38 on the submount 36. The design of the pattern of conductive region 38 is not limited to the one shown in the figures, as long as the design is suitable for wire bonding thereby lowering the capacitance effect. The anode and cathode can be located respectively on the upper and lower sides of the laser diode 30, wherein an electrode 34 of the laser diode 30 is connected conductively with the conductive region 38 on the submount 36, and the electrode 34 is extended with the use of the conductive region 38 on the submount 36. Besides, the other electrode 32 of the laser diode 30 is totally different from the electrode 34 in the electrical property, and is located on the upper side of the laser diode 30. Hence, the sub-assembly structure 40 of the laser diode of the present invention is formed. The submount of the sub-assembly structure of the present invention is made of low-capacitance material, such as aluminum nitride, aluminum oxide and silicon oxide, etc. Further, the subassembly structure of the laser diode of the present invention can be individually used as a high-frequency light source transmitter.

Figure 6A:
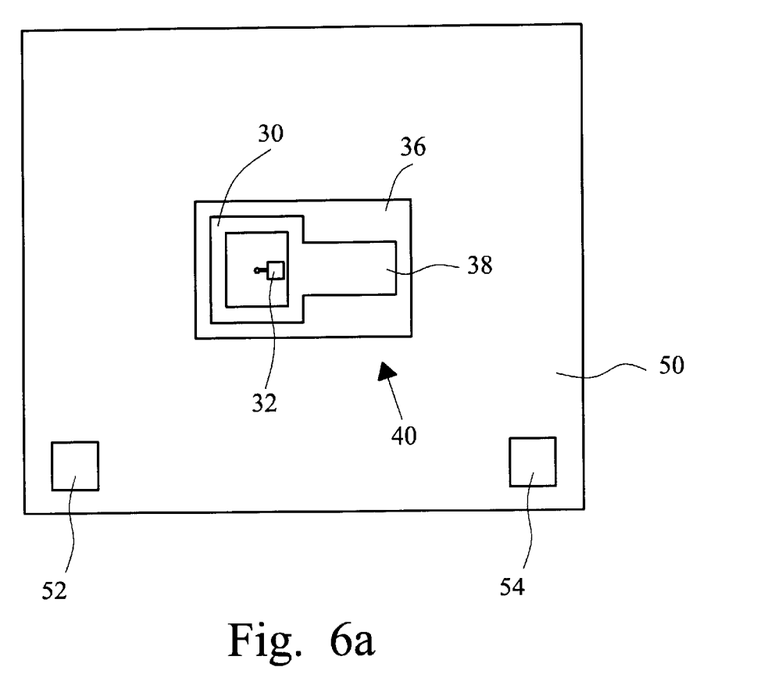
FIG. 6a is a top view showing a common assembly structure of VCSEL and monitoring PIN detector according to the present invention.
Figure 6B:
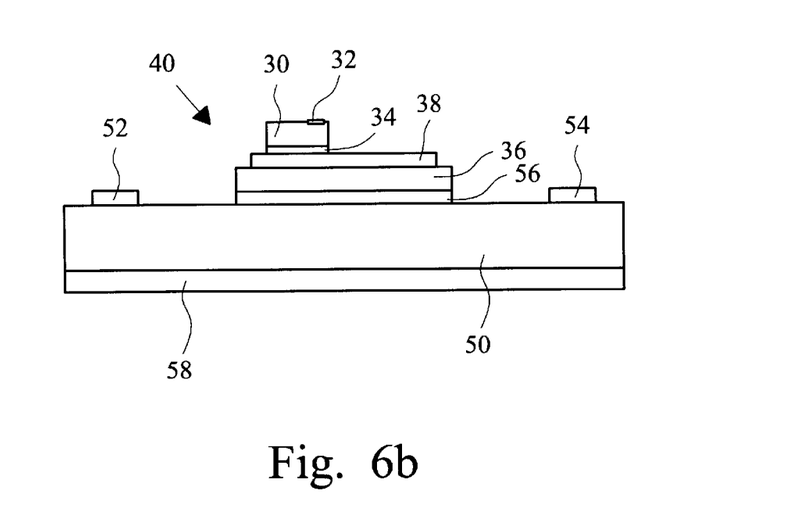
FIG. 6b is a cross-sectional view showing the common assembly structure of VCSEL and monitoring PIN detector according to the present invention.

FIG. 6a is a top view showing a common assembly structure of laser diode and PIN detector according to the present invention, and FIG. 6b is a cross-sectional view showing the common assembly structure of laser diode and PIN detector according to the present invention. Referring to FIG. 6a and FIG. 6b at the same time, the PIN detector 50 of the present invention has an anode and a cathode, wherein an electrode 52 is a small region located on the upper surface of the PIN detector 50, and on the upper surface of the PIN detector 50, there is an electrode 54 which is totally different from the electrode 52 in the electrical property. The PIN detector 50 utilizes a semi-insulating type or conductive type (N-type or P-type) submount to meet the requirements of various assemblies. If the conductive type submount is used, a dielectric layer 58 is usually formed under the PIN detector 50 for isolating an electrical connection. The aforementioned sub-assembly structure 40 is implemented on the center of the upper surface of the PIN detector 50 without connecting to the electrode 52, and on the sub-assembly structure 40, the surface not having the laser diode 30 is adhered to the upper surface of PIN detector with the use of an adhesive material 56 made of isolation material, so that the sub-assembly structure is electrically isolated from the PIN detector 50. Thus, the common assembly structure of laser diode and PIN detector has four electrodes in total, which are the electrodes 32 and 34 of the laser diode and the electrodes 52 and 54 of the PIN detector respectively, and the common assembly structure of laser diode and PIN detector according to the present invention is completed. The P and N electrodes of the PIN detector used herein are not limited to being on the same surface, and can also be on the upper and lower surfaces respectively.

Figure 7:
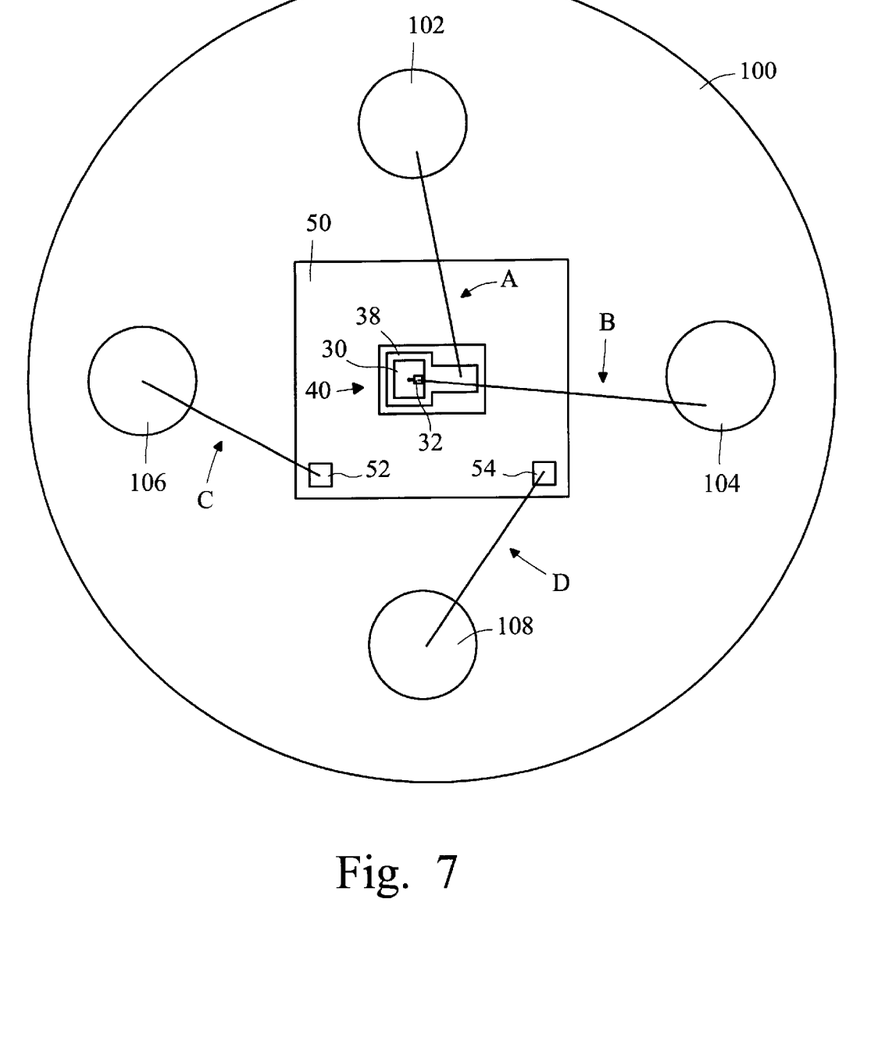
FIG. 7 is a top view showing a common assembly structure of VCSEL and monitoring PIN detector according to the present invention, wherein the common assembly structure is implemented on a submount.

Besides, the common assembly structure of laser diode and PIN detector according to the present invention can be implemented on a header or a submount, and has more varieties through the design of header or submount. The present invention can be used in forming a TO-CAN type assembly by wiring electrodes externally to the pins of TO-CAN type assembly, as shown in FIG. 7. FIG. 7 is a top view showing a common assembly structure of laser diode and PIN detector according to the present invention, wherein the common assembly structure is implemented on a submount, and the submount 100 has an electrode 102, an electrode 104, an electrode 106 and an electrode 108, and the common assembly structure of laser diode and PIN detector is located at the center of the submount 100. In the embodiment, one electrode 54 of the PIN detector 50 is connected to the electrode 108 of the submount 100 with a conductive wire D, and the other electrode 52 of the PIN detector 50 is connected to the electrode 106 of the submount 100 with a conductive wire C, wherein the electrode 52 is totally different from the electrode 54 in the electrical property. Further, in the sub-assembly structure 40, a conductive region 38 extended from the electrode 34 (not shown) of the laser diode 30 is connected to the electrode 102 of the submount 100 with a conductive wire A, and the other electrode 32 of the laser diode is connected to the electrode 104 of the submount 100 with a conductive wire B, wherein the electrode 32 is totally different from the electrode 34 in the electrical property. Accordingly, the anode and cathode of the laser diode and the anode and cathode of the PIN detector are formed independently.

Figure 8:
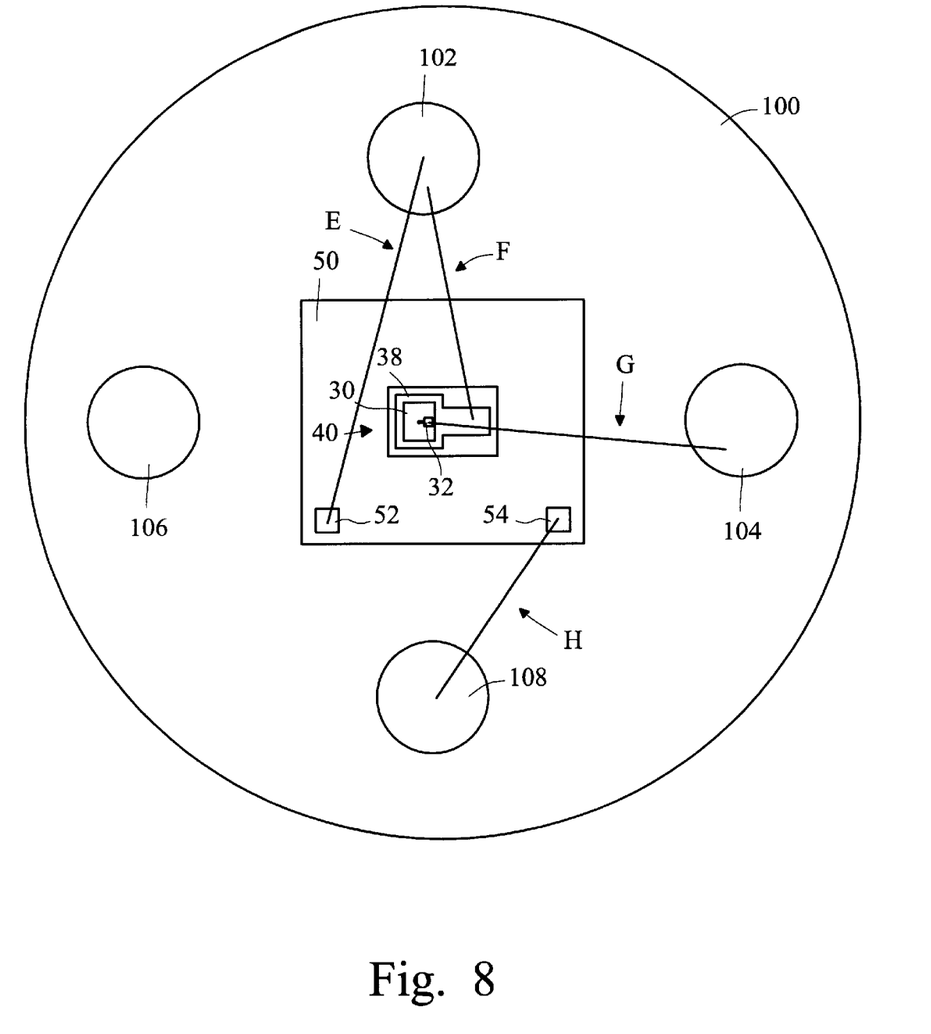
FIG. 8 is a top view showing a common assembly structure of VCSEL and monitoring PIN detector according to an embodiment of the present invention, wherein the common assembly structure is applied in a common cathode assembly of laser diode.

Since the assembly of submount and photo/laser diodes is independent of the TO-CAN type assembly, common anode assembly and common cathode assembly can also be fabricated with a skipping connection method. FIG. 8 is a top view showing a common assembly structure of laser diode and PIN detector according to an embodiment of the present invention, wherein the common assembly structure is applied in a common cathode assembly of laser diode, and a submount 100 has an electrode 102, an electrode 104, an electrode 106 and an electrode 108, and the common assembly structure of laser diode and PIN detector of the present invention is implemented on the center of the submount 100. In the embodiment, an electrode 54 of the PIN detector 50, for example, a cathode, is connected to the electrode 108 of the submount 100 with a conductive wire H, and an electrode 52 of the PIN detector 50, for example, an anode, is connected to the electrode 102 of the submount 100 with a conductive wire E, and further, in the sub-assembly structure 40, a conductive region 38 extended from an electrode 34 (not shown) of the laser diode 30, for example, a cathode, is connected to the electrode 102 of the submount 100 with a conductive wire F, and an electrode 32 of the laser diode 30, for example, an anode, is connected to the electrode 104 of the submount 100 with a conductive wire G. Hence, the cathode (not shown) of the laser diode 30 and the anode 52 of the PIN detector 50 are connected to the electrode 102 of the submount 100, and accordingly, a common cathode assembly of laser diode is formed.

Figure 9:
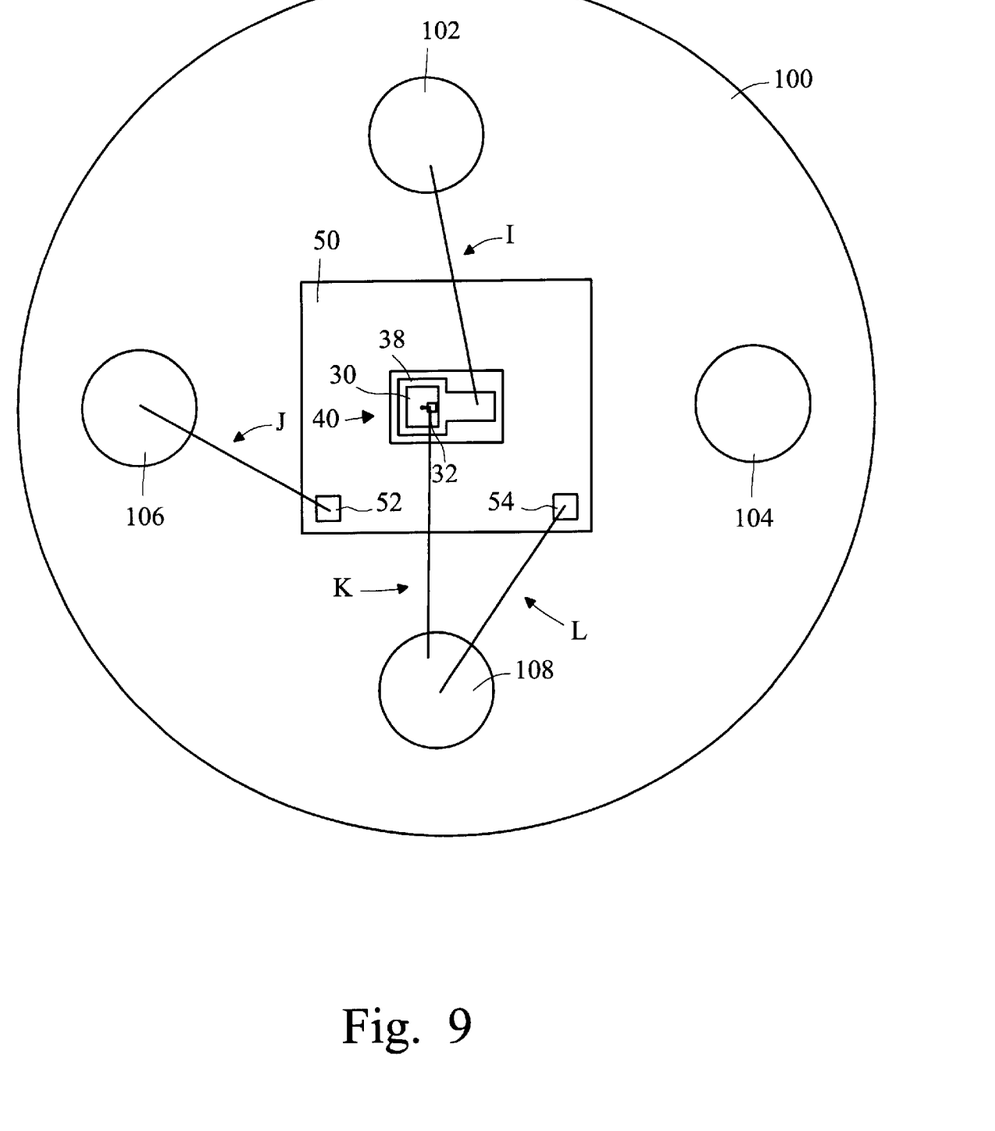
FIG. 9 is a top view showing a common assembly structure of VCSEL and monitoring PIN detector according to an embodiment of the present invention, wherein the common assembly structure is applied in a common anode assembly of VCSEL.

In the same way, the present invention can be applied in a common anode assembly of laser diode. FIG. 9 is a top view showing a common assembly structure of laser diode and PIN detector according to an embodiment of the present invention, wherein the common assembly structure is applied in a common anode assembly of laser diode, and a submount 100 has an electrode 102, an electrode 104, an electrode 106 and an electrode 108, and the common assembly structure of laser diode and PIN detector is implemented on the center of the submount 100. In the embodiment, a cathode 54 of the PIN detector 50 is connected to the electrode 108 of the submount 100 with a conductive wire L, and an anode 52 of the PIN detector 50, is connected to the electrode 106 of the submount 100 with a conductive wire J, and further, in the subassembly structure 40, a conductive region 38 extended from a cathode 34 (not shown) of the laser diode 30 is connected to the electrode 102 of the submount 100 with a conductive wire I, and an anode 32 of the laser diode 30 is connected to the submount 100 with a conductive wire K. Hence, the anode 32 of the laser diode 30 and the cathode 52 (not shown) of the PIN detector 50 are connected to the submount 100, and accordingly, a common anode assembly of laser diode is formed.

It is noted that aforementioned the locations and patterns among the laser diode, the PIN detector and the submount, and the electrode polarities, locations and wirings of these diodes are just stated as examples, and the actual products may have different designs in accordance with the requirements, so that the present invention is not limited thereto.

In the common assembly structure of laser diode and PIN detector according to the present invention, since the electrodes of semiconductor laser are completely separated from the electrodes of PIN detector, the semiconductor laser can be modulated with a differential driving method so as to promote the modulation speed of semiconductor laser. Further, the assembly structure of the present invention comprises a PIN detector, so that the modulation circuit by differential driving can provide the function of feedback and compensation to the PIN detector.

The common assembly structure of laser diode and PIN detector according to the present invention can be applied in a TO-CAN type assembly. In the preferred embodiments of the present invention, the common assembly structure can promote the operating frequency effectively to 2.5 giga bit per second (Gbps) and progressively toward the target of 10 Gbps. The assembly structure of the present invention can be applied not only in a TO-CAN type assembly, but also in various types of header or submount. Through the design of header or submount, the present invention can extend the limit of high-speed application.

The utilization of the present invention can make the semiconductor laser have an extremely low parasitic capacitance so as to broaden the operating frequency of the application of semiconductor laser. With a single assembly structure type, the present invention can be suitable for use in different circuit structures of both common anode driving and common cathode driving thereby improving the complexity of functional design for a conventional common anode (or cathode) assembly of laser diode.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A common assembly structure of laser diode and PIN detector, comprising:
   a PIN detector, wherein the PIN detector has a first anode and a first cathode, and the first anode and the first cathode are located on the same side of the PIN detector; and
   a sub-assembly structure, located on a PIN detector, wherein the sub-assembly structure comprises:
   a submount; and
   a laser diode, located on the submount, wherein the laser diode has a second anode and a second cathode, and the second anode of the laser diode is electrically isolated from the first cathode of the PIN detector, and the second cathode of the laser diode is electrically isolated from the first anode of the PIN detector.

2. The common assembly structure of laser diode and PIN detector of claim 1, wherein the submount is selected from a group of low-capacitance material consisting of aluminum nitride, aluminum oxide and silicon oxide.

3. The common assembly structure of laser diode and PIN detector of claim 1, wherein the laser diode is a vertical cavity surface emitting laser (VCSEL).

4. The common assembly structure of laser diode and PIN detector of claim 1, wherein the second anode and the second cathode are located on the same side of the laser diode.

5. The common assembly structure of laser diode and PIN detector of claim 1, wherein the second anode and the second cathode are located on the different sides of the laser diode.

6. A common assembly structure of laser diode and PIN detector, comprising:
- a PIN detector, wherein the PIN detector has a first electrode and a second electrode, and the first electrode is different from the second electrode in electrical property, and the first electrode and the second electrode are located on a first side of the PIN detector;
- a submount, having a third electrode; and
- a sub-assembly structure having a conductive region located on the PIN detector, wherein the sub-assembly structure is electrically isolated from the first electrode of the PIN detector and the second electrode of the PIN detector, and the sub-assembly structure comprises:
  - a laser diode located on the conductive region, wherein the laser diode has a fourth electrode and a fifth electrode, and the fourth electrode is electrically connected to the conductive region, and the fifth electrode is electrically connected to the third electrode of the submount, and the fourth electrode is different from the fifth electrode in electrical property.

7. The common assembly structure of laser diode and PIN detector of claim 6, wherein the submount is selected from a group of low-capacitance material consisting of aluminum nitride, aluminum oxide, silicon oxide and metal.

8. The common assembly structure of laser diode and PIN detector of claim 6, wherein the laser diode is a VCSEL.

9. The common assembly structure of laser diode and PIN detector of claim 6, wherein the submount further has a sixth electrode electrically connected to the conductive region; a seventh electrode electrically connected to the first electrode; and an eighth electrode electrically connected to the second electrode.

10. The common assembly structure of laser diode and PIN detector of claim 6, wherein the submount further has a sixth electrode electrically connected to the conductive region and to the first electrode; and a seventh electrode electrically connected to the second electrode.

11. The common assembly structure of laser diode and PIN detector of claim 6; wherein the second electrode is electrically connected to the third electrode, and the submount further has a sixth electrode electrically connected to the conductive region; and a seventh electrode electrically connected to the first electrode.

12. A common assembly structure of laser diode and PIN detector, comprising:
- a PIN detector, wherein the PIN detector has a first anode and a first cathode, and the first anode and the first cathode are located on the same side of the PIN detector; and
- a laser diode, located on the PIN detector, wherein the laser diode has a second anode and a second cathode, and the second anode of the laser diode is electrically isolated from the first cathode of the PIN detector, and the second cathode of the laser diode is electrically isolated from the first anode of the PIN detector.

13. The common assembly structure of laser diode and PIN detector of claim 12, wherein the laser diode is a vertical cavity surface emitting laser (VCSEL).

14. The common assembly structure of laser diode and PIN detector of claim 12, wherein the second anode and the second cathode are located on the same side of the laser diode.

15. The common assembly structure of laser diode and PIN detector of claim 12, wherein the second anode and the second cathode are located on the different sides of the laser diode.

* * * * *